United States Patent [19]

Frear et al.

[11] Patent Number: 5,300,307

[45] Date of Patent: Apr. 5, 1994

[54] MICROSTRUCTURE CONTROL OF AL-CU FILMS FOR IMPROVED ELECTROMIGRATION RESISTANCE

[75] Inventors: Darrel R. Frear; Joseph R. Michael; Alton D. Romig, Jr., all of Albuquerque, N. Mex.

[73] Assignee: The United States of America as represented by the United States Department of Energy, Washington, D.C.

[21] Appl. No.: 944,865

[22] Filed: Sep. 14, 1992

[51] Int. Cl.$^5$ .............................................. B05D 5/12
[52] U.S. Cl. .................................... 427/96; 427/123; 427/374.3; 427/379; 427/393.5; 437/198; 204/192.15
[58] Field of Search .................. 427/383.5, 374.3, 380, 427/124, 96, 379, 123; 437/198, 188; 204/192.15

[56] References Cited

U.S. PATENT DOCUMENTS 3,848,330 11/1974 Hall et al. ............................ 437/198
3,879,840 4/1975 Ames et al. .......................... 437/198

OTHER PUBLICATIONS

A. D. Romig, et al., High-Spatial-Resolution X-Ray Microanalysis of Al-2 wt. % Cu Aluminum Thin Films, pp. 216–217; Proceedings of the 47th Annual Meeting of the Electron Microscopy Society of America (1989).
D. R. Frear, et al., The Evolution of Microstructure in Al-2 Pct Cu Thin Film: Precipitation, Dissolution, and Reprecipitation; Metallurgical Transactions A; vol. 21A, Sep. 1990.
D. R. Frear, et al., The Effect of Cu At Al Grain Boundaries on Electromigration Behavior in Al Thin Films (1991).
J. R. Michael, et al., Grainboundary Chemistry in Al-Cu Metallizations as Determined by Analytical Electron Microscopy (no date).

Primary Examiner—Michael Lusignan
Assistant Examiner—David M. Maiorana
Attorney, Agent, or Firm—Timothy D. Stanley; George H. Libman

[57] ABSTRACT

A process for the forming of Al-Cu conductive thin films with reduced electromigration failures is useful, for example, in the metallization of integrated circuits. An improved formation process includes the heat treatment or annealing of the thin film conductor at a temperature within the range of from 200° C. to 300° C. for a time period between 10 minutes and 24 hours under a reducing atmosphere such as 15% $H_2$ in $N_2$ by volume. Al-Cu thin films annealed in the single phase region of a phase diagram, to temperatures between 200° C. and 300° C. have $\theta$-phase $Al_2Cu$ precipitates at the grain boundaries continuously become enriched in copper, due, it is theorized, to the formation of a thin coating of $\theta$-phase precipitate at the grain boundary. Electromigration behavior of the aluminum is, thus, improved because the $\theta$-phase precipitates with copper hinder aluminum diffusion along the grain boundaries. Electromigration, then, occurs mainly within the aluminum grains, a much slower process.

18 Claims, 4 Drawing Sheets

MICROSTRUCTURE CONTROL OF AL-CU FILMS FOR IMPROVED ELECTROMIGRATION RESISTANCE

The United States Government has rights in this invention pursuant to Contract No. DE-AC04-76DP00789 between the Department of Energy and the American Telephone and Telegraph Company.

BACKGROUND OF THE INVENTION

1. Field of the Invention

This invention relates to thin film electrical conductors and their methods of manufacture for use in integrated circuit application. More specifically, this invention relates to Al-Cu film electrical conductors for integrated circuit application.

2. Description of the Prior Art

Aluminum thin films are commonly used as the conductor metallization for integrated circuit applications. With trends towards smaller linewidths carrying larger current densities, electromigration failures have become a reliability issue in aluminum conductors. Small additions of copper to aluminum (<4% by weight) have been found to increase electromigration lifetime by up to two orders of magnitude. However, the increase in lifetime is not consistently reproducible. The variability of electromigration behavior is the result of the microstructural inhomogeneity of the Al-Cu thin films which is not optimized to improve the electromigration behavior.

Al lines, made up from an Al-Cu alloy, are used as electrical interconnects for transistors, resistors, capacitors and all other components found within an integrated circuit (IC). The access time for an IC (the time within which it completes its designated task) typically goes down as the IC gets smaller and more densely packed. Power consumption and generated heat also go down as a device (IC) gets smaller. Strong market demand for energy efficient and faster integrated circuits is one of the driving factors behind smaller linewidth process technology. As the device density (i.e., 1 million transistors per chip) goes up, the acceptable line widths for the Al interconnects must be reduced to accommodate the higher device density. Under constant current, as an Al line gets thinner, the current density being carried by that line goes up. In other words, more electrons are forced to pass through an increasingly narrower cross section of Al. The electric field within the Al conductor creates a chemical potential gradient. This chemical potential gradient drives the process called diffusion which results in the movement of atoms within the conductor. The net movement of atoms in one direction results in a net movement of atomic vacancies (missing atoms in the crystal structure) in the opposite direction. Atomic diffusion occurs faster along defects in the crystalline material called grain boundaries. The increased atomic diffusion rate at grain boundaries is mainly related to the increased amount of free space at the boundary due to the mismatch of the crystal planes in adjacent crystals (grains). These vacancies can accumulate at certain parts of the microstructure and form voids which coalesce into larger voids which eventually can cause a break in the conductor. The movement of atoms and vacancies in this manner is termed electromigration and can result in failure of the IC.

Current state of the art has recognized that additions of copper to aluminum improve electromigration resistance. However, the mechanism by which copper alters electromigration behavior is unknown. Currently, copper is used in aluminum thin films as a "magic powder". Any thermal cycle to which the films are exposed in prior art practice are incidental to the process used to manufacture the integrated circuit rather than for the optimization of the thin film microstructure and therefore the conductive characteristics and, as such, are not necessarily optimized or consistently practiced to improve those characteristics. The present invention describes the mechanism for microstructural control and consequent electromigration improvement. The invention further details a process to microengineer the microstructure of aluminum-copper thin films to optimize electromigration resistance.

The present invention overcomes prior art shortcomings by providing a thermal treatment process designed to optimize the microstructure for electromigration resistance and therefore, behavior of Al-Cu thin films by engineering the thin film microstructure. In the as-deposited condition, the copper is present in the form of $\theta$-phase $Al_2Cu$ precipitates distributed randomly throughout the film both within the aluminum grains and at the grain boundaries. The formation of large $\theta$-phase precipitates and a continuous coherent film of $\theta$-phase precipitates at the aluminum grain boundaries impedes diffusion along the high diffusivity path in the thin film. As a result, the aluminum diffuse more slowly through the film and the electromigration lifetime is increased.

This is accomplished through a thermal treatment process that will cause the formation of large $\theta$-phase precipitates and a coherent continuous thin layer of $\theta$-phase precipitates to form on aluminum grain boundaries which slows aluminum diffusion during electromigration. The thermal treatment is in the range of 200° to 300° C. for up to 24 hours depending on temperature. This heat treatment causes the $\theta$-phase precipitates inside the aluminum grains to dissolve and the coherent thin layer $\theta$-phase precipitates at the grain boundaries to form.

The most important application of this invention is to inhibit Al diffusion along the thin film grain boundaries through enrichment of Cu at the Al grain boundaries. If the diffusion of Al atoms and vacancies is restricted along the grain boundaries, the resistance to electromigration should be increased, thereby extending the life of the IC.

SUMMARY OF THE INVENTION

The present invention relates to the production of thin film aluminum conductors for integrated circuit applications wherein electromigration failures are reduced. The present invention further relates to the production of thin film aluminum conductors having up to 4% copper wherein a heat treatment is employed to optimize the effect of Cu in the suppression of electromigration failures.

An object of the invention is to provide an improved process for forming thin film aluminum conductors having a decreased rate of electromigration failures.

A further object of the invention is to provide an improved process for forming thin film aluminum conductors having up to 4% copper and having a decreased rate of electromigration failure.

A still further object of the invention is to provide an improved process for forming thin film aluminum conductors having up to 4% copper and 1% silicon and having a decreased rate of electromigration failure.

Additional objects, advantages and novel features of the invention will become apparent to those skilled in the art upon examination of the following description or may be learned by practice of the invention. The objects and advantages of the invention may be realized and attained by means of the processes particularly pointed out in the appended claims.

To achieve the foregoing and other objects and in accordance with the purpose of the present invention, as embodied and broadly described herein, the present invention may comprise a process for producing a thin layer conductive aluminum film having reduced electromigration failures. The process includes the steps of depositing an aluminum-copper alloy thin film on a substrate, heating the thin film to a sufficient temperature (which is less than the solvus temperature of the film) and for a sufficient length of time for copper enrichment to occur at aluminum grain boundaries, and cooling the thin film to a lower temperature.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

Figure 1:
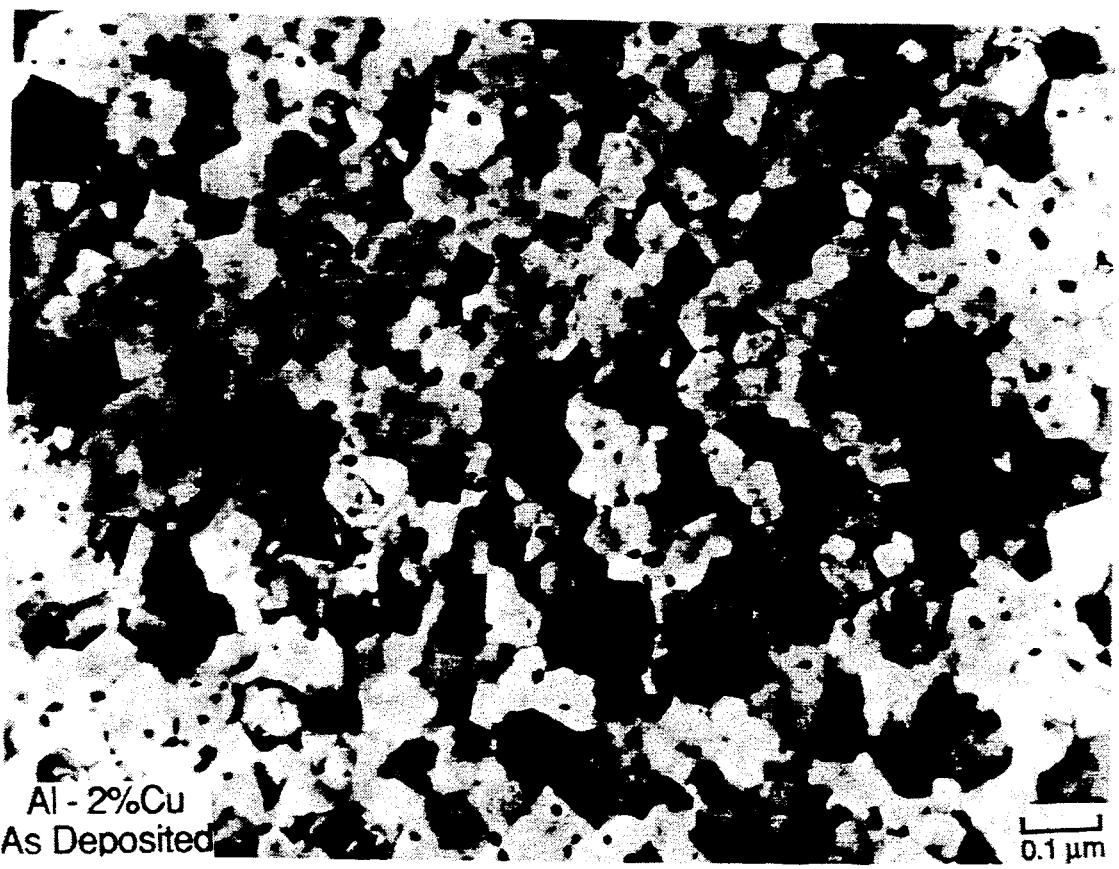
FIG. 1 is a photomicrograph of a thin film specimen illustrating the microstructure of an as-deposited Al-2% Cu thin film.

The present invention overcomes prior art shortcomings by providing a thermal treatment process designed to optimize the electromigration behavior of Al-Cu thin films by engineering the thin film microstructure by providing copper enrichment at aluminum grain boundaries in the film.

The mechanism for this enrichment is believed to be as follows: In the as-deposited condition, the copper is present in the form of $\theta$-phase $Al_2Cu$ precipitates distributed randomly throughout the film both within the aluminum grains and at the grain boundaries. The formation of large $\theta$-phase precipitates and a continuous coherent film of $\theta$-phase precipitates at the aluminum grain boundaries removes the high diffusivity path in the thin film. As a result, the aluminum must diffuse through the bulk which occurs at a much slower rate and the electromigration lifetime is increased.

This is accomplished through a thermal treatment process that will cause the formation of large $\theta$-phase precipitates and a coherent continuous thin layer of $\theta$-phase precipitates to form on aluminum grain boundaries which slows aluminum diffusion during electromigration. The thermal treatment is in the range of 200° to 300° C. for up to 24 hours depending on temperature. This heat treatment causes the $\theta$-phase precipitates inside the aluminum grains to dissolve and the coherent thin layer $\theta$-phase precipitates at the grain boundaries to grow.

Specific steps for a preferred embodiment of this process include:

1) Sputter deposition of Al-Cu thin films at room temperature.
2) Heat treat the deposited film at 425° C. for 35 minutes. Heat treatment should be performed in a reducing atmosphere of forming gas (15% $H_2$ in $N_2$). Air cool the deposited film to room temperature. This step grows the aluminum grains and initiates $\theta$-phase precipitation at the grain boundaries.
3) Perform a heat treatment at between 200° and 300° C. from 10 minutes to 24 hours. This step can also be performed under forming gas, but it is not critical. This step causes a depletion of copper from within the aluminum grains and causes large $\theta$-phase precipitates to form at the aluminum grain boundaries and as an $Al_2Cu$ film at the grain boundaries. Air cool to room temperature. The resulting structure is more resistant to electromigration.

A preferred composition for the Al-Cu thin film is Al-2% Cu. Other levels of copper in aluminum thin films ranging from $\frac{1}{4}$% to 4% Cu are also contemplated by the invention, with or without 1% silicon. The methodology described here is applicable to other combinations of Al and Cu however the details (i.e., time and temperature) may vary. The presence of silicon, a known practice in the art, is for purposes other than the reduction of electromigration (i.e., prevention of Al "spiking") and has no known effect on the practice of the present invention. In addition, the presence of small amounts of other materials are not believed to adversely effect the process.

The Al-2 wt % Cu alloy is deposited using a process called sputtering. IC wafers are put into an evacuated chamber with a cylinder (sometimes called a source or plug). The source is an alloy of Al-2 wt % Cu which will be transferred to the wafer by using heat and high energy ions. As deposited, the alloy is not a uniform solid solution with Al and Cu evenly distributed on the wafer. The metallization lines actually form with small nodular collections of $Al_2Cu$ in an otherwise homogenous sea of Al and Cu atoms. These nodular collections are called $\theta$-precipitates.

Under normal principles of metallurgical diffusion, as temperature is elevated, Cu is expected to travel (diffuse) through the Al lattice and seek out precipitates where it would chemically bond with Al atoms and cause the $Al_2Cu$ precipitate to grow. The Cu in the precipitate is in a lower energy state than the Cu in the solid solution alloy (bulk Al lattice). The Cu thus tends to be bound in a precipitate rather than remain dispersed in the lattice. Conversely, a Cu atom located between two Al grains (i.e., in the grain boundary) is in a particularly unstable high energy position. The normal expected behavior would be for that Cu atom to diffuse at a high rate along the grain boundary until it encounters a precipitate, also on the boundary, and join with it at a reduced energy state. This behavior is called an example of the Collector Plate Mechanism, a known principle of material behavior.

If the Cu behaved as described above, the result would be a depletion of atomic Cu at all grain boundaries, with an increase in Cu occurring as you move into the bulk (Al lattice) or as you move into a precipitate. The inventors have discovered that by annealing the alloy at between 200° to 300°, an enrichment of Cu at the grain boundaries is achieved which is the opposite of what would be expected if the Collector Plate Mechanism were operative.

Tests have been conducted according to the invention, which result in the enrichment (increase in concentration) of Cu, either in its atomic form or as a compound, at the grain boundaries of Al-Cu alloy thin films used, for example, as interconnects near the last layers of processing found on commercially produced integrated circuits. The enrichment is produced by subjecting the deposited Al to an annealing process which lowers the density of $Al_2Cu$ precipitates within the interior of the Al grains (called the bulk) and redistributing the Cu between the grains. Copper situated in the grain boundaries blocks what are normally the high diffusity paths for Al diffusion through the Al when a current is induced.

EXAMPLE

The following example is provided to further illustrate the present invention. Specimens were prepared as follows: the substrates for the Al-2% Cu films were first chemically vapor deposited (CVD) with borosilicate glass (BSG). Al-2% Cu was then magnetron sputter deposited at room temperature onto the substrates from a single source. The actual wafer temperature was ~100° C. due to heating during sputtering. The Al-2% Cu films were nominally 4000 Å thick. Annealing was performed at 425° C. for 35 minutes in 15% $H_2$-$N_2$ followed by natural cooling to room temperature.

Specimens of Al-Cu thin films were inspected and analyzed with analytical and transmission electron microscopes (AEM's and TEM's). Plan view samples for the AEM and TEM were prepared from the heat treated specimens. Discs 3 mm in diameter were ultrasonically cut from the Si wafer. The back side of the discs were mechanically thinned to about 50 μm. The front side of the wafer was protected with lacquer and the remaining Si removed by chemical dissolution in a solution of 5% $HF$+95% $HNO_3$. The BSG was removed by low temperature $Ar^+$ ion beam milling at 5 keV which usually required about 10 minutes. The analytical equipment also included electron probes and x-ray analysis systems. Sufficient resolution was achieved to highlight and distinguish individual precipitate clusters and to examine the distribution of those clusters both within the grains (bulk distribution) as well as along the grain boundaries. The probe equipment permitted "pinpoint" quantitative analysis as to percentage Cu concentration at locations extremely close to either side of a grain boundary. The probe equipment allowed for detection of Cu in percentages and quantities that were not visible using the other electron imaging techniques. The copper concentration profiles were obtained by stepping the probe equipment across grain boundaries in the aluminum thin films oriented so that the boundaries were parallel to the electron beam. Profiles were taken across grain boundary segments which ran between $\theta$-phase precipitates. Computer control of the probe allowed for analyses to be taken at 5 nm steps. Copper and aluminum x-ray emissions from the sample were collected and converted into composition values.

The microstructure of the as-deposited Al-2% Cu thin film is shown in FIG. 1. This film was deposited at room temperature ($\approx$100° C.) so only a limited amount of annealing could occur during deposition and only $\theta$-phase $Al_2Cu$ precipitates form. The limited annealing also restricted grain size growth which was measured to be in the area of approximately 0.1 μm. The $\theta$-phase precipitates have a fine homogeneous distribution throughout the film both within the grains and at the aluminum grain boundaries.

After the thermal anneal at 425° C., subsequent heat treatments were performed at 200° C. for 10 days, 40 days, and 80 days, 300° C. for one hour, 4 hours and 8 hours, and 400° C. for one minute, 4 minutes, and 8 minutes. All three of the heat treatment temperatures were below the solvus point for the alloy, such that the sample was never heated outside of the two phase region (Al+$\theta$) for this portion of the experiment.

Figure 2:
FIG. 2 is a photomicrograph of an Al-2% Cu thin film specimen as in FIG. 1 which has been annealed at 425° C. for 35 minutes.

A TEM micrograph of the as-deposited and annealed (425° C. for 35 minutes) Al-2% Cu thin film is shown in FIG. 2. The $\theta$-phase $Al_2Cu$ precipitates are now present only at the aluminum grain boundaries in the form of plates. Grain growth produced in a larger aluminum grain size of 1.0 μm.

The heat treatments at 200° C. and 300° C. are significant in that accelerated electromigration testing (destructive testing) normally occurs within this temperature range. The microstructure that results from heat treatment at these two temperatures was identical. Furthermore, little difference was observed in the microstructure as a function of annealing times.

Figure 3:
FIG. 3 is a photomicrograph of an Al-2% Cu thin film specimen as in FIG. 2, subsequently heat treated at 200° C. for 10 days according to the invention.

FIG. 3 shows an electron micrograph of a specimen heat treated at 200° C. for 10 days. The $\theta$-phase precipitates are primarily located at aluminum grain boundaries and triple points. The $\theta$-phase precipitates undergo Ostwald coarsening at these temperatures where the large precipitates at the grain boundaries grow at the expense of the smaller precipitates within the aluminum grains.

Figure 4:
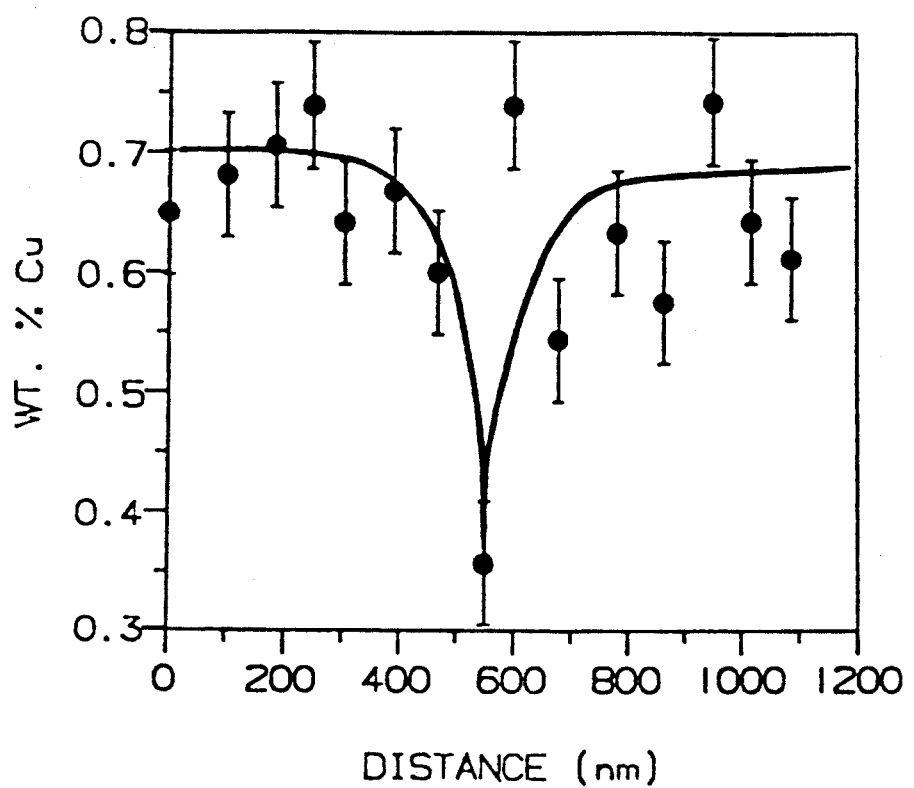
FIG. 4 is a chart illustrating the measured concentration profile of an Al-2% Cu thin film specimen heat treated at 400° C. for one minute.
Figure 5:
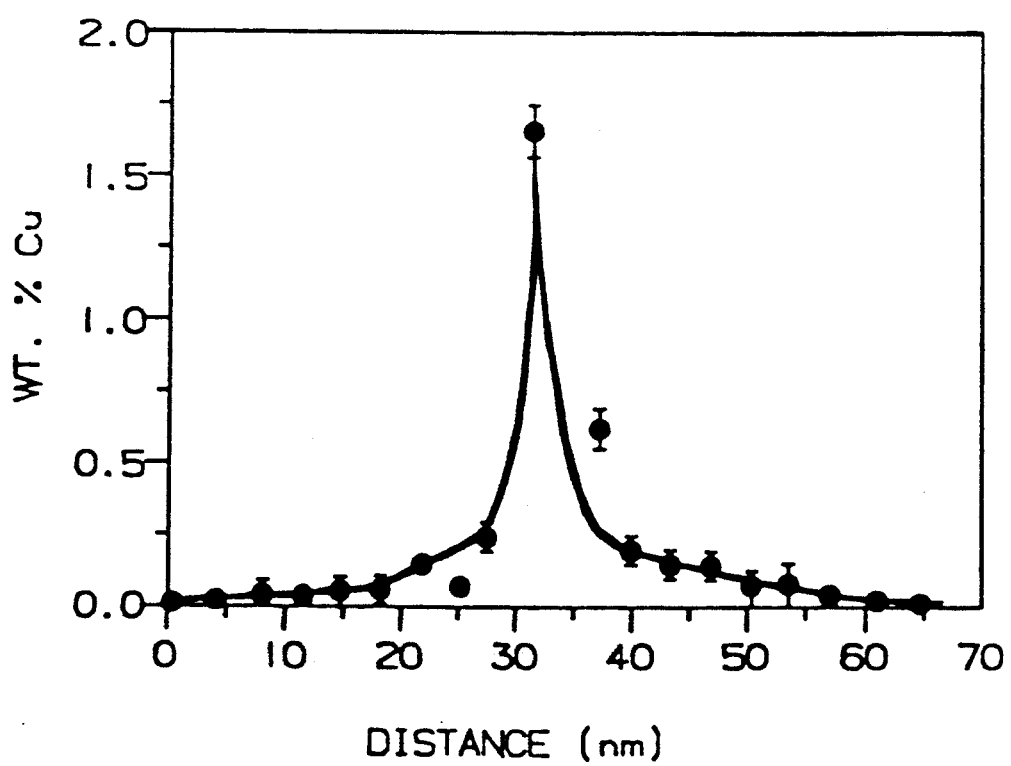
FIG. 5 is a chart illustration the measured concentration profile of an Al-2% Cu thin film specimen heat treated at 200° C. for 10 days.

FIG. 4 shows the concentration profile for a specimen heat treated at 400° C. The aluminum grain boundaries were depleted with copper as shown. The solute profiles of copper at 200° and 300° C. however, were significantly different than those obtained at 400° C. Rather than depletion, the aluminum grain boundaries were enriched with copper. FIG. 5 shows the concentration profile for a specimen held at 200° C. for 10 days. The boundary is enriched relative to the matrix (bulk). The apparent grain boundary composition is 1.8 wt. % Cu. The actual composition is somewhat higher. Because of the measuring technique used, the 1.8% measurement represents an average of the grain boundary and matrix near (<5 nm) the boundary.

During heat treatments, at temperatures within the two-phase region, copper segregates directly to aluminum grain boundaries, without diffusing along the boundary to seek out the nearest boundary precipitate. The enrichment of copper at the boundary is unexpected since the copper's energy state along the grain boundary is at a higher level (more unstable) than the copper bound within a precipitate. The segregation occurs during the time at temperature and is not influenced during cool-down. It is theorized that as the copper segregates to the grain boundary it reacts with the aluminum there to form a thin film or plate of $\theta$- phase. The driving force for θ-phase nucleation is so large and the copper mobility so small that the thin film θ-phase precipitates directly along all of the grain boundaries. It was not possible to view a separate phase at the grain boundaries using standard electron microscopy imaging techniques. However, the layer is extremely thin, on the order of 5-7 nm, so higher resolution techniques are required to positively establish the existence of this phase.

The redistribution of copper (in a specific form) to the aluminum grain boundaries has a definite improvement in electromigration behavior. However, if the copper resides at the boundary in the ordinary precipitate state (or a similar precursor to the θ-phase) an incoherent interface could exist between the precipitate and the aluminum grain. This incoherent interface acts as much as a high diffusivity path as the grain boundary it displaced, negating the beneficial effects of the copper that is present. If, however the precipitate/grain interface is coherent, the diffusion rate is greatly reduced.

The experimental results have shown that there is enrichment by a very thin layer of copper at aluminum grain boundaries. This enrichment may be, as discussed above, in the form of a thin layer, possibly one or two monolayers, of $Al_2Cu$ or some meta-stable precursor. This thin a layer could be coherent on one or both sides of the aluminum grain boundary. By being coherent, the interface diffusivity would be diminished. As a result, electromigration lifetime is increased with the presence of copper.

It has not been positively established why enrichment of Cu at the grain boundaries would restrict the flux of diffusing atoms. The simplest explanation is that the boundaries without enrichment are actually spaces along which Al atoms can diffuse with ease. Atomic motion or diffusion within the bulk requires that a vacancy present itself "in front of" the diffusing atom before it can move within the lattice (bulk). Migration occurs when the Al atom and the vacancy "trade places". Since the grain boundary is open space, it is viewed by the Al atom as an assembly of vacancies along which transport is very fast.

It is also believed that the migration that ultimately leads to vacancy imbalance and failure can be restricted if we fill the grain boundary voids with something to restrict the flow of Al atoms. Cu in the grain boundaries is believed to do this. The crystallographic structure of the enriched Cu at the grain boundaries is still unknown. It could be atomic Cu or very small deposits of precipitate ($Al_2Cu$).

Electrical resistance tests further substantiated the formation of θ-phase precipitates upon heat treatment of Al-2% Cu-1% Si specimens. Over time, a 10% drop in resistance was observed in these specimens when held at 226° C. over a 330 minute period. Within the same period, a drop in resistance of only 0.9% was observed in pure aluminum specimens. This is attributable to the redistribution of copper to the aluminum grain boundaries (believed to be θ-phase film), reducing the number of precipitates in the bulk of the aluminum grains, thus resulting in a drop in electrical resistance.

The particular process steps and conditions discussed above are cited merely to illustrate the practice of the invention. It is contemplated that the practice of the invention may involve other embodiments as long as the principle, i.e., the employment of a heat treatment for Al-Cu conductive thin films to reduce electromigration failures, is followed. For example, the heat treatment of the invention could be preceded by another heat treatment at a temperature greater than the solvus temperature in order to dissolve copper homogeneously throughout the film. Although theories have been advanced above as to the mechanism by which decreased electromigration in Al-Cu conductive thin films is accomplished through practice of the invention, the scope of the invention should not be limited to those theories, but should be interpreted as including other theories as well. It is intended that the scope of the invention be defined by the claims appended hereto.

We claim:

1. A process for producing a thin layer conductive aluminum film having reduced electromigration failures, comprising:
   depositing an aluminum-copper alloy thin film on a substrate;
   heating said thin film to a first temperature and maintaining said film at said first temperature for a first length of time; and
   heating said thin film to a second temperature, said second temperature being lower than said first temperature, and maintaining said thin film at said second temperature for a second time period sufficient for copper enrichment to occur at grain boundaries of said thin film.

2. The process of claim 1, wherein said thin film comprises in the range of from 0.25 to 4.0 percent copper in aluminum by weight.

3. The process of claim 2, wherein said thin film comprises about 2 percent copper in aluminum by weight.

4. The process of claim 2, wherein said thin film further comprises about 1 percent silicon by weight.

5. The process of claim 1, wherein said second temperature is less than the solvus temperature of said film.

6. The process of claim 1, wherein said heat treatment steps are performed in a reducing atmosphere of forming gas having a composition of about 15 percent hydrogen in nitrogen by volume.

7. The process of claim 1, wherein said second temperature is in the range of from 200° C. to 300° C.

8. The process of claim 7, wherein said second temperature is about 300° C.

9. The process of claim 1, wherein said second time period is in the range of from 10 minutes to 24 hours.

10. The process of claim 9, wherein said second time period is about 24 hours.

11. The process of claim 8, wherein said second time period is about 1 hour.

12. In a process for forming conductive films on a substrate in the manufacture of integrated circuit computer chips wherein an aluminum-copper alloy film is deposited on said substrate, the improvement comprising:
   heating said thin film to a sufficient temperature and for a sufficient length of time for forming a substantially continuous, coherent copper precipitate along the grain boundaries of the deposited film; and
   cooling said thin film to a lower temperature.

13. The improvement of claim 12, wherein said sufficient length of time is between 10 minutes and 24 hours.

14. The improvement of claim 13, wherein said sufficient length of time is about 1 hour and said temperature is about 300° C.

15. A process for producing thin layer conductive films having reduced electromigration failures comprising:

sputter depositing an aluminum-copper alloy thin film having about 2 percent copper in aluminum by weight on a substrate at about room temperature;

performing a first heat treatment of said thin film, said treatment comprising:

heating said thin film to a first temperature above the solvus temperature of said film;

maintaining said thin film at said first temperature for a first time period; and cooling said thin film to about room temperature; and performing a second heat treatment of said thin film, said treatment comprising:

heating said thin film to a second temperature less than the solvus temperature of said film;

maintaining said thin film at said second temperature for a time period sufficient for copper enrichment to occur at aluminum grain boundaries; and cooling said thin film to about room temperature.

16. The process of claim 1, wherein said first temperature is higher than the solvus temperature of said film.

17. The process of claim 1, further including cooling said thin film to a third temperature after said first heat treatment, wherein said third temperature is lower than said second temperature.

18. The process of claim 1, further including the step of cooling said thin film to a third temperature after said second heat treatment, wherein said third temperature is lower than said second temperature.

* * * * *